(12) United States Patent
Mii et al.

(10) Patent No.: US 8,143,155 B2
(45) Date of Patent: Mar. 27, 2012

(54) WIRE BONDING METHOD AND SEMICONDUCTOR DEVICE

(75) Inventors: Tatsunari Mii, Ube (JP); Shinsuke Tei, Musashimurayama (JP); Hayato Kiuchi, Musashimurayama (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 12/589,481

(22) Filed: Oct. 21, 2009

(65) Prior Publication Data
US 2010/0207280 A1 Aug. 19, 2010

(30) Foreign Application Priority Data
Oct. 27, 2008 (JP) .................................. 2008-275346

(51) Int. Cl.
*H01L 21/44* (2006.01)
(52) U.S. Cl. ..................................... 438/617; 228/180.5
(58) Field of Classification Search .................. 438/617; 228/180.5
See application file for complete search history.

(56) References Cited

U.S. PATENT DOCUMENTS

| | | | |
|---|---|---|---|
| 6,112,974 A | | 9/2000 | Nishiura et al. |
| 6,222,274 B1 * | | 4/2001 | Nishiura et al. ............. 257/776 |
| 2004/0104477 A1 * | | 6/2004 | Fujisawa ..................... 257/738 |
| 2004/0262369 A1 | | 12/2004 | Mii et al. |
| 2006/0151579 A1 | | 7/2006 | Fujisawa et al. |
| 2006/0163331 A1 * | | 7/2006 | Babinetz ..................... 228/180.5 |
| 2007/0003467 A1 | | 1/2007 | Sunkara et al. |
| 2009/0020872 A1 * | | 1/2009 | Mii et al. ..................... 257/737 |
| 2010/0059574 A1 * | | 3/2010 | Arahata et al. ............. 228/180.5 |

FOREIGN PATENT DOCUMENTS

| | | |
|---|---|---|
| JP | H09-51011 | 2/1997 |
| JP | 2000-114304 | 4/2000 |
| JP | 2004-172477 | 6/2004 |
| JP | 2005-19778 | 1/2005 |
| JP | 2005-39192 | 2/2005 |
| JP | 2005-167178 | 6/2005 |
| JP | 2005-340777 | 12/2005 |
| JP | 2006-196495 | 7/2006 |

* cited by examiner

*Primary Examiner* — Thao Le
*Assistant Examiner* — Geoffrey Ida
(74) *Attorney, Agent, or Firm* — Katten Muchin Rosenman LLP

(57) ABSTRACT

After forming a pressure-bonded ball and a ball neck by bonding an initial ball to a pad, a capillary is moved upward, away from a lead, and then downward, thereby the ball neck is trodden on by a face portion that is on the lead side of the capillary. Subsequently, the capillary is moved upward and then toward the lead until the face portion of the capillary is positioned above the ball neck, thereby a wire is folded back toward the lead. Then, the capillary is moved downward such that a side of the wire is pressed by the capillary against the ball neck that has been trodden on. After the capillary is moved obliquely upward toward the lead and then looped toward the lead, the wire is pressure-bonded to the lead.

11 Claims, 6 Drawing Sheets

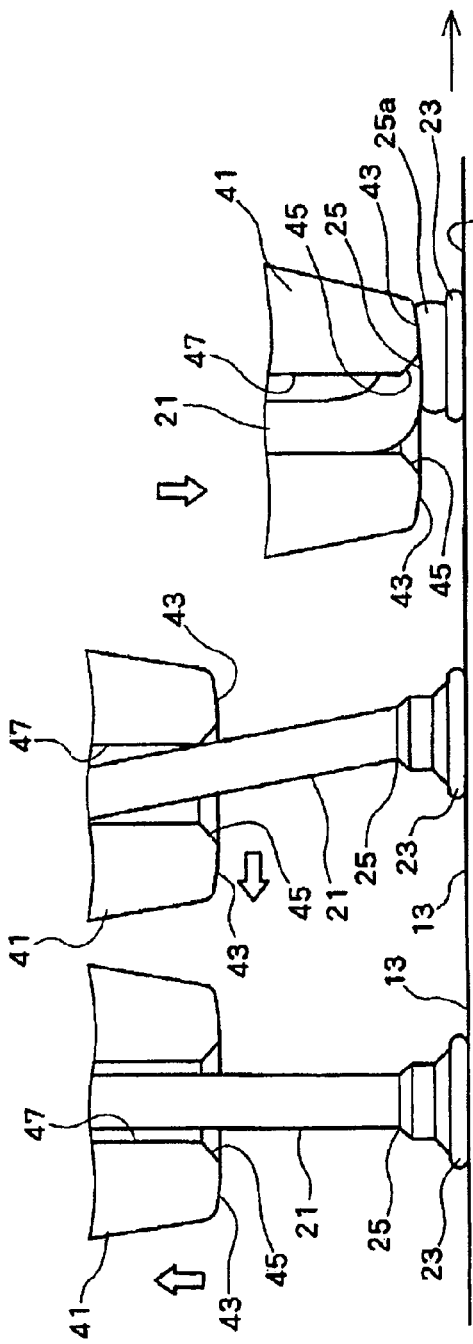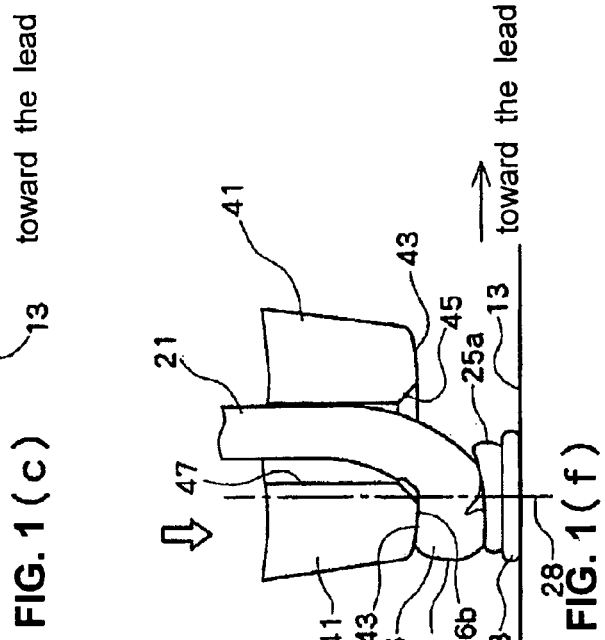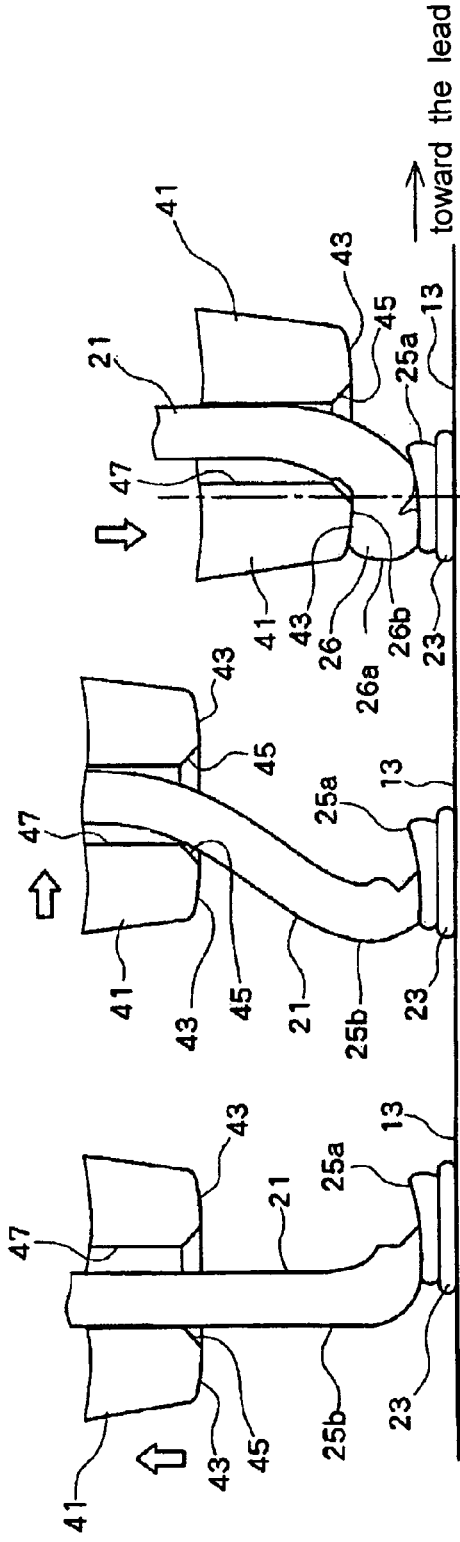

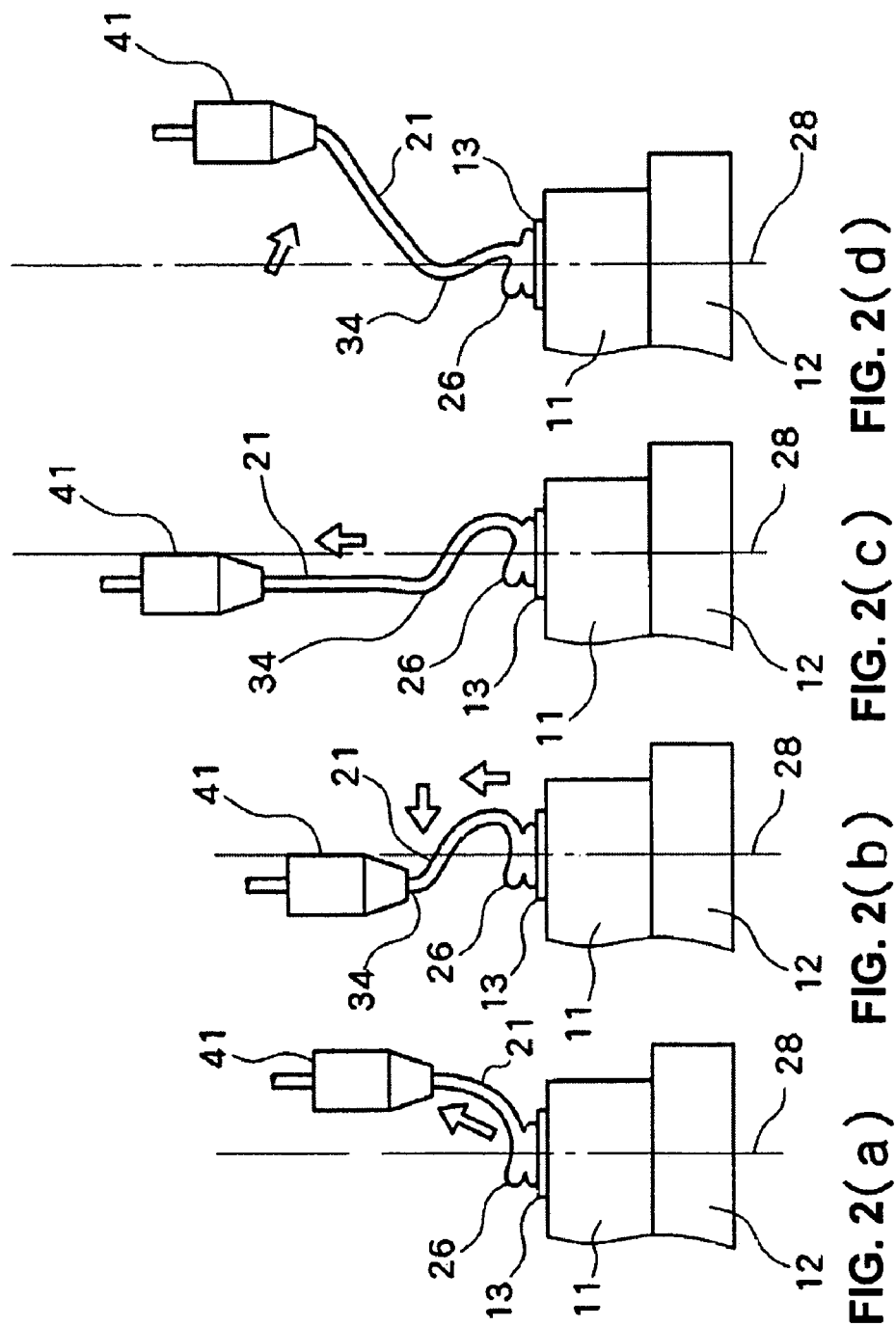

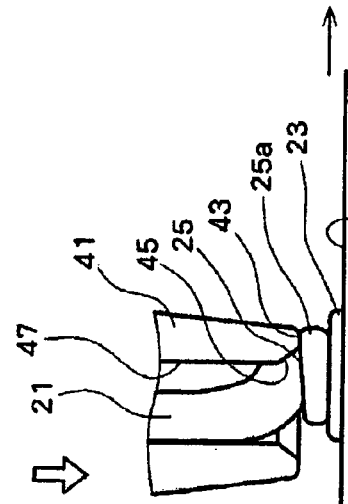
FIG. 4(a)
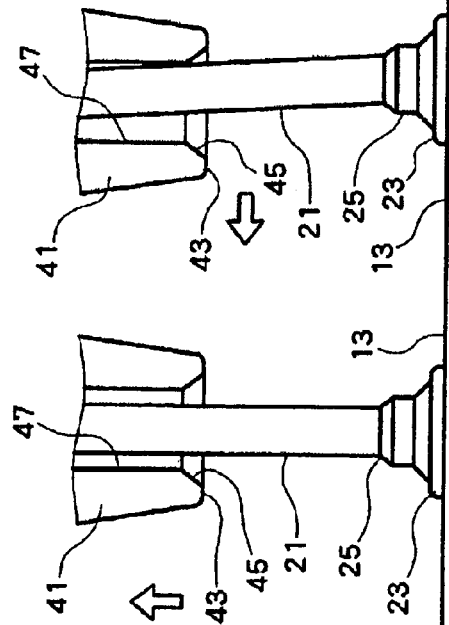
FIG. 4(b)
FIG. 4(c)
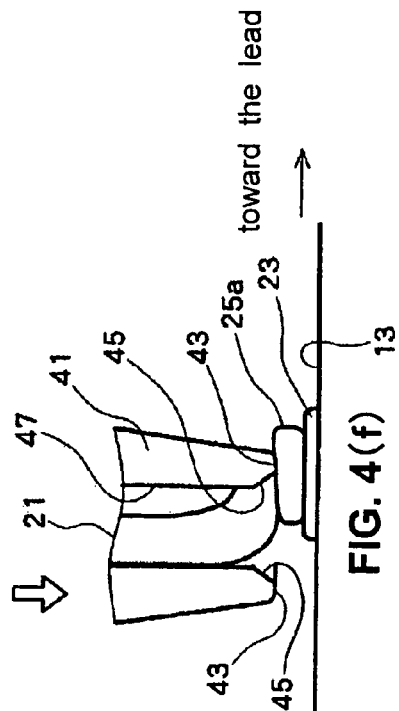
FIG. 4(d)
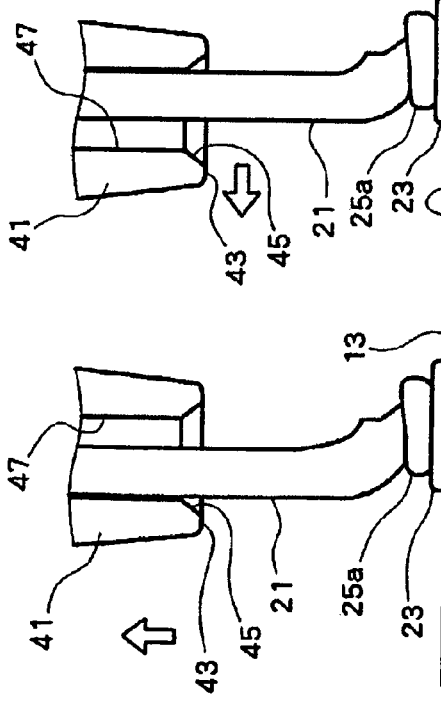
FIG. 4(e)
FIG. 4(f)

WIRE BONDING METHOD AND SEMICONDUCTOR DEVICE

BACKGROUND OF THE INVENTION

1. Technical Field

The present invention relates to a wire-bonding method of connecting a first bonding point with a second bonding point by a wire, and to a semiconductor device having a wire-loop shape formed by connecting a first bonding point with a second bonding point by a wire.

2. Description of the Related Art

For assembling a semiconductor device, wire bonding for connecting a pad of a semiconductor chip mounted on a lead frame with a lead of the lead frame by a thin metal wire is used. A wire-bonding apparatus is used in the wire bonding, in which an initial ball is first formed at a tip end of the wire, and the initial ball is pressure-bonded to the pad of the semiconductor chip using the capillary, thereby forming a pressure-bonded ball. In this method, after moving the capillary upward to make a reverse motion in a direction away from a second bonding point, the capillary is further moved upward to a predetermined height, and then moved toward the second bonding point, thereby the wire is connected to the second bonding point (see FIG. 4 to FIG. 6 of Japanese Unexamined Patent Application Publication No. 2004-172477 (hereinafter referred to as "Patent Document 1"), for example).

The wire is bonded by moving the capillary in this manner, and, in many cases, a shape of a wire loop is formed either in a triangular shape including a wire neck that extends upward from the pressure-bonded ball that has been pressure-bonded onto the pad of the semiconductor chip and a sloped portion that has been bent toward the second bonding point at the wire neck, or in a trapezoidal shape including a flat portion that extends substantially horizontally in a direction of the second bonding point from the wire neck and a sloped portion that extends from the flat portion toward the second bonding point. This is because, when a portion close to the pressure-bonded ball is moved horizontally in the direction of the second bonding point with respect to the capillary, the neck portion is often damaged due to a friction between the capillary and the thin metal wire that is produced while moving.

However, the height of the wire loop in this wire-loop shape is high because the wire neck that rises from the pressure-bonded ball is included, and this poses a problem that the height or thickness of the semiconductor device assembled by wire bonding as a whole cannot be made small.

Therefore, a method has been proposed, making a reverse motion such that a capillary is moved slightly upward and away from a second bonding point after bonding to a first bonding point, making a forward motion such that the capillary is further moved slightly upward and in a direction toward the second bonding point, then moving the capillary downward to press a wire neck portion against a pressure-bonded ball and fold the wire neck portion up on the pressure-bonded, making the wire to extend either in a horizontal direction or in a direction slightly sloped upward from the horizontal direction, moving the capillary upward while feeding the wire from a tip end of the capillary, and then moving the capillary toward the second bonding point, thereby connecting the wire to the second bonding point (see FIG. 1 to FIG. 3 of Patent Document 1, or FIG. 1 to FIG. 3 of Japanese Unexamined Patent Application Publication No. H09-51011 (hereinafter referred to as "Patent Document 2"), for example).

According to the conventional bonding method described in the Patent Document 1 or 2, as a wire is folded up onto a pressure-bonded ball and then pressed to form a head portion, the head portion cannot be made particularly low. As a result, the conventional bonding method occasionally fails to satisfy the demand for decreasing the height of the wire loop as a whole.

BRIEF SUMMARY OF THE INVENTION

In view of the above problem, an object of the present invention is to reduce the height of the wire loop when connecting a first bonding point with a second bonding point.

A wire-bonding method according to the present invention is a wire-bonding method of connecting between a first bonding point and a second bonding point by a wire, and the method includes: a first bonding step of bonding an initial ball formed at a tip end of the wire onto the first bonding point using a capillary, thereby forming a pressure-bonded ball and a ball neck; a ball neck treading step, after the first bonding step, of moving the capillary upward, away from the second bonding point, and then downward, thereby treading on the ball neck facing toward the second bonding point with a face portion on the second bonding point side of the capillary; a pressing step, after the ball neck treading step, of moving the capillary upward and then toward the second bonding point until the face portion away from the second bonding point of the capillary is positioned above the ball neck such that the wire is folded back toward the second bonding point, and subsequently moving the capillary downward, thereby pressing a side surface of the wire that has been folded back on the ball neck that has been trodden on by the face portion away from the second bonding point of the capillary; an oblique-upward rising step, after the pressing step, of moving the capillary obliquely upward toward the second bonding point; and a second bonding step, after the oblique-upward rising step, of moving the capillary upward and then toward the second bonding point, and bonding the wire onto the second bonding point by pressure-bonding.

In the wire-bonding method according to the present invention, it is also preferable that, in the ball neck treading step, a continuous movement be repeated for a plurality of times after the first bonding step, the continuous movement including moving the capillary upward, away from the second bonding point, and then downward, thereby treading on the ball neck facing toward the second bonding point with the face portion on the second bonding point side of the capillary.

Moreover, it is also preferable that the wire-bonding method according to the present invention further include a kink forming step, between the oblique-upward rising step and the second bonding step, of moving the capillary upward and then carrying out a reverse motion at least once in which the capillary is moved away from the second bonding point, thereby forming a kink in the wire.

A semiconductor device according to the present invention is a semiconductor device having a wire-loop shape that connects between a first bonding point and a second bonding point by a wire, and the semiconductor device is produced by a process including: a first bonding step of bonding an initial ball formed at a tip end of the wire onto the first bonding point using a capillary, thereby forming a pressure-bonded ball and a ball neck; a ball neck treading step, after the first bonding step, of moving the capillary upward, away from the second bonding point, and then downward, thereby treading on the ball neck facing toward the second bonding point with a face portion on the second bonding point side of the capillary; a pressing step, after the ball neck treading step, of moving the capillary upward and then toward the second bonding point until the face portion away from the second bonding point of the capillary is positioned above the ball neck such that the wire is folded back toward the second bonding point, and subsequently moving the capillary downward, thereby pressing a side surface of the wire that has been folded back on the ball neck that has been trodden on by the face portion away from the second bonding point of the capillary; an oblique-upward rising step, after the pressing step, of moving the capillary obliquely upward toward the second bonding point; and a second bonding step, after the oblique-upward rising step, of moving the capillary upward and then toward the second bonding point, and bonding the wire onto the second bonding point by pressure-bonding.

Also, in the semiconductor device according to the present invention, it is also preferable that, in the ball neck treading step, a continuous movement be repeated for a plurality of times after the first bonding step, the continuous movement including moving the capillary upward, away from the second bonding point, and then downward, thereby treading on the ball neck facing toward the second bonding point with the face portion on the second bonding point side of the capillary.

The present invention provides an advantageous effect of reducing height of a wire loop in connecting a first bonding point with a second bonding point.

BRIEF DESCRIPTION OF THE SEVERAL VIEWS OF THE DRAWINGS

FIGS. 1 (a) through 1 (f) are an illustrative diagram showing a treading step and a pressing step in a bonding method of an exemplary embodiment according to the present invention;

FIGS. 4 (a) through 4 (f) are an illustrative diagram showing a treading step in the bonding method of a different exemplary embodiment according to the present invention.

DETAILED DESCRIPTION OF THE INVENTION

Figure 2E:
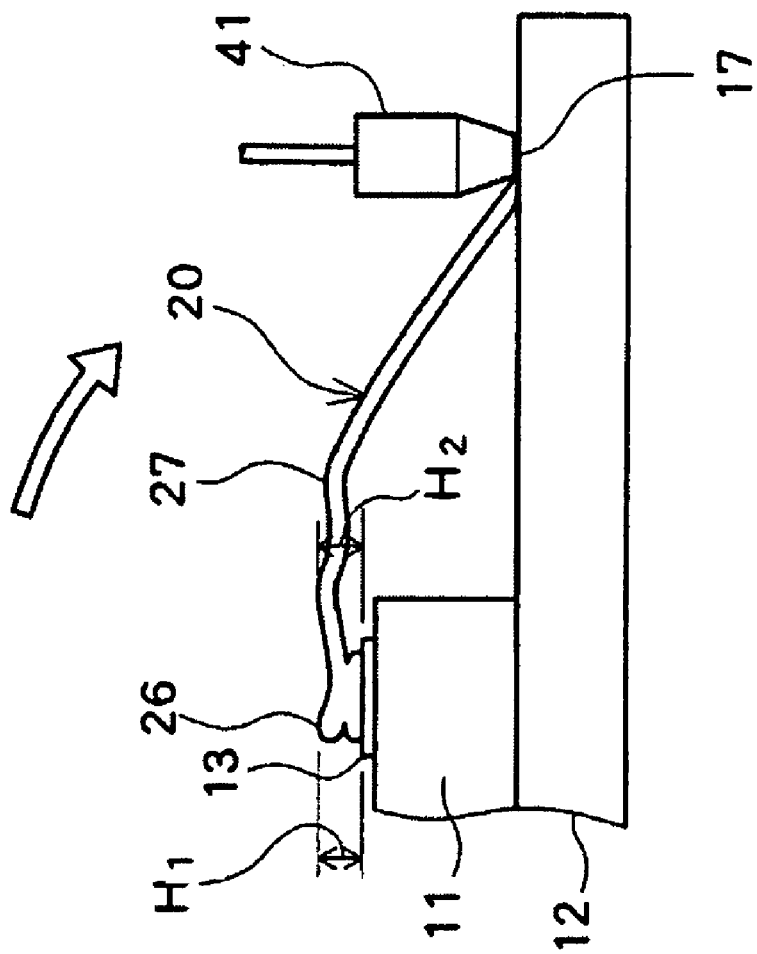
FIGS. 2 (a) through 2 (e) are an illustrative diagram showing a kink forming step and a second bonding step in the bonding method of an exemplary embodiment according to the present invention, and a wire loop of an exemplary embodiment according to the present invention.
Figure 3:
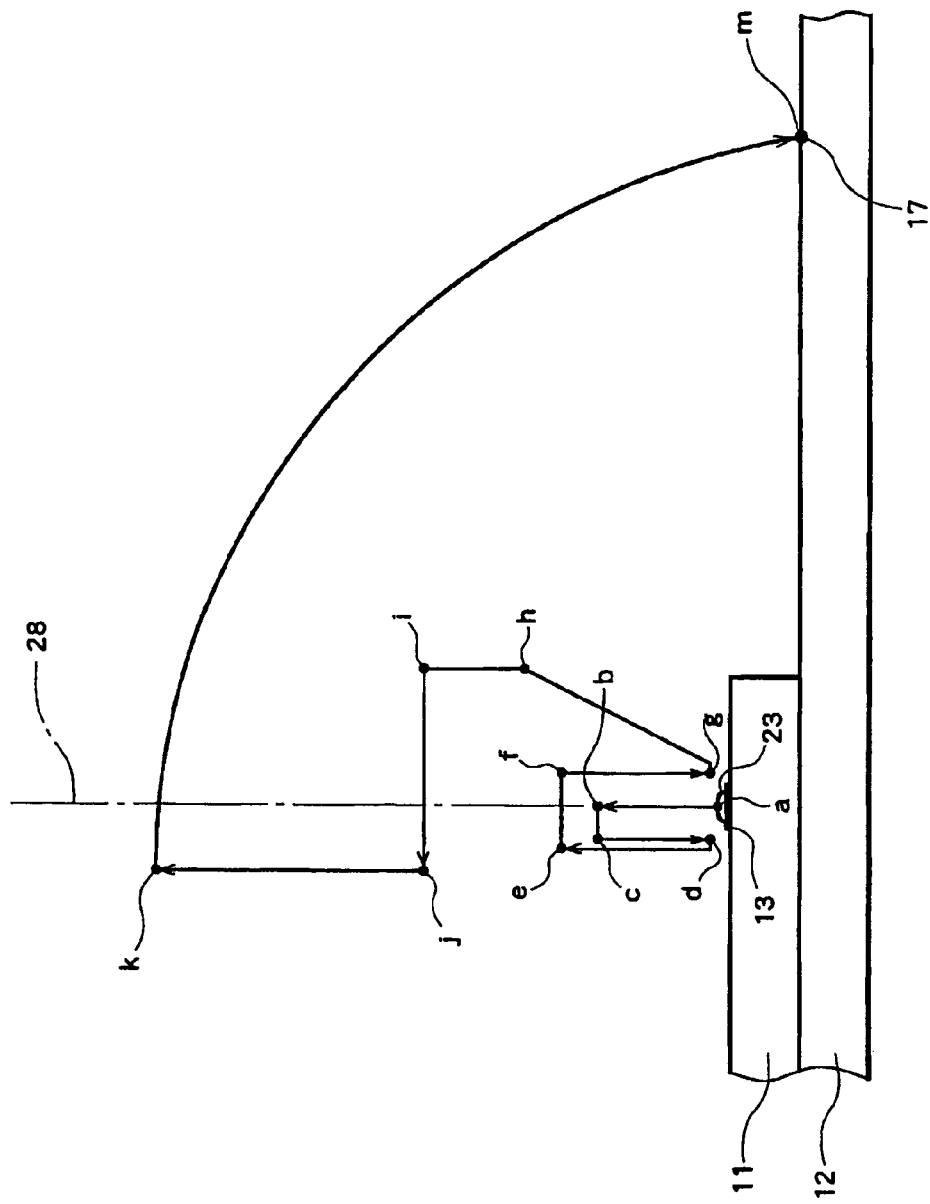
FIG. 3 is an illustrative diagram showing a movement of a tip end of a capillary in the bonding method of an exemplary embodiment according to the present invention.

The following describes an exemplary embodiment according to the present invention with reference to FIG. 1 to FIG. 3. As shown in FIG. 1 and FIG. 2, this exemplary embodiment relates to a wire-bonding method of connecting a pad 13 of a semiconductor chip 11 mounted on a lead frame 12 with a lead 17 formed on the lead frame 12, and to a semiconductor device having a wire loop 20 formed by this wire-bonding method. While a semiconductor device is provided with wire loops that connect a plurality of pads 13 with leads 17, respectively, the connection between a single pad 13 and a single lead 17 is described in the following. The pad 13 of the semiconductor chip 11 corresponds onto a first bonding point, and the lead 17 of the lead frame 12 corresponds onto a second bonding point. Although the lead 17 is not shown in FIG. 1, the lead 17 is at the right side in the drawing. Also, FIG. 3 is a diagrammatic view showing a movement of the tip end of a capillary 41.

First, a first bonding step is carried out, in which an initial ball that is not shown in the Figures and formed at an end portion of a wire 21 is pressed and bonded onto the pad 13 by the capillary 41 while applying ultrasonic vibration, thereby a pressure-bonded ball 23 and a ball neck 25 are formed on the pad 13. The pressure-bonded ball 23 is formed by flattening out the spherical initial ball with a face portion 43 of the capillary 41 into a disk-shape, and the ball neck 25 is formed by a portion of the initial ball intruding between an inner chamfer 45 and a straight hall 47 of the capillary 41. The ball neck 25 extends toward the wire 21 from the pressure-bonded ball 23, and has a circular cylindrical shape whose diameter is substantially as large as that of the straight hole 47 of the capillary 41, whose diameter is greater than that of the wire 21. When pressing the capillary 41 against the pad 13, the tip end of the capillary 41 is positioned at a point a above the pressure-bonded ball 23 shown in FIG. 3.

After the first bonding step, a treading step as shown from FIG. 1 (a) to FIG. 1 (c) is carried out. In the treading step, as shown by FIG. 1 (a), the tip end of the capillary 41 is moved to a point b from the point a shown in FIG. 3, by moving the capillary 41 upward while feeding the wire 21. Then, as shown by FIG. 1 (b), the capillary 41 is moved away from the lead 17 until the face portion 43 which is on the lead 17 side of the capillary 41 is positioned above the ball neck 25, thereby moving the tip end of the capillary 41 to a point c from the point b shown in FIG. 3. At this time, the wire 21 is sloped from the ball neck 25 toward a direction opposite from the lead 17. Then, the tip end of the capillary 41 is moved down to a point d from the point c shown in FIG. 3, and a portion of the ball neck 25 facing toward the lead 17 is trodden on by the face portion 43 which is on the lead 17 side of the capillary 41 as shown by FIG. 1 (c). By the treading, the cylindrical ball neck 25 is formed into a disk-shaped trodden portion 25a whose diameter is slightly smaller than that of the pressure-bonded ball 23. Being fattened by the face portion 43 of the capillary 41, an upper surface of the trodden portion 25a on the lead 17 side is made into a flat plane that fits the shape of the face portion 43. Moreover, the wire 21 is bent toward a portion of the trodden portion 25a facing away from the lead 17, and extends upright in a direction perpendicular to the pad 13 along an inner surface of the straight hole 47 facing away from the lead 17 of the capillary 41.

Next, a pressing step as shown from FIG. 1 (d) to FIG. 1 (f) is carried out. As shown by FIG. 1 (d), the tip end of the capillary 41 is moved upward to a point e from the point d shown in FIG. 3 while feeding the wire 21 from the tip end of the capillary 41. With this, the wire 21 is fed out linearly along the straight hole 47 of the capillary 41. Then, the tip end of the capillary 41 is moved toward the lead 17, to a point f from the point e shown in FIG. 3. With this, as shown by FIG. 1 (e), the wire 21 is pushed toward the lead 17 by the inner chamfer 45 of the capillary 41 and bent at a bent portion 25b that continues from the trodden portion 25a. Then, the capillary 41 is moved toward the lead 17 until the face portion 43 away from the lead 17 of the capillary 41 is positioned above the pressure-bonded ball 23. Then, the tip end of the capillary 41 is moved down to a point g. from the point f shown in FIG. 3. As a result, as shown by FIG. 1 (f), by this downward movement of the capillary 41, a side surface of the wire 21 is pressed against the upper surface of the trodden portion 25a that has been formed by treading on the ball neck 25. With this pressing of the wire 21, the bent portion 25b of the wire 21 is folded back to the trodden portion 25a, and thus a folded-up portion 26a is formed. A pressed portion 26 of the wire 21 facing toward the pad 13 is pressed against the upper surface of the trodden portion 25a by the pressing, and an upper surface of the pressed portion 26 is formed into a flat plane by the face portion 43 of the capillary 41. Upon completion of the pressing step, the capillary 41 is positioned closer to the lead 17 with respect to a bonding center line 28 of the pad 13.

When pressing the wire 21 against the trodden portion 25a with the face portion 43 of the capillary 41, the capillary 41 can be moved reciprocatingly in a direction toward and away from the lead 17 at the same time with the pressing so that the wire 21 is fitted with the trodden portion 25a. Alternatively, the pressing of the wire 21 can be carried out while vibrating the tip end of the capillary 41 by ultrasonic vibration.

As shown by FIG. 2 (a), after the pressing step, an oblique-upward rising step is carried out in which the capillary 41 is moved obliquely upward toward the lead 17, to a point h from the point g shown in FIG. 3 while moving the capillary 41 upward with the wire 21 being fed out from the tip end of the capillary 41. With this oblique-upward rising step, a kinked portion that projects toward the lead 17 is formed in the wire 21.

As shown by FIG. 2 (b), after the oblique-upward rising step, a kink forming step is carried out. In the kink forming step, after the tip end of the capillary 41 is moved upward to a point i from the point h shown in FIG. 3 while feeding out the wire 21 from the tip end of the capillary 41, a reverse motion toward the direction away from the lead 17 is made and the tip end of the capillary 41 is moved to a point j from the point i shown in FIG. 3. With this movement, the capillary 41 that has been positioned closer to the lead 17 with respect to the bonding center line 28 of the pad 13 upon completion of the previous pressing step is positioned away from the lead 17. With this reverse motion, the wire 21 that has risen from a portion of the pad 13 facing toward the lead 17 is formed into a sloped shape curving toward the direction away from the lead 17. In contrast, as the wire 21 within the capillary 41 is held substantially perpendicular to a surface of the pad 13, a kink 34 that projects toward the direction away from the lead 17 is formed in the wire 21 near the tip end of the capillary 41 when the reverse motion is completed.

As shown from FIG. 2 (c) to FIG. 2 (e), a second bonding step is carried out subsequently to the reverse motion. As the tip end of the capillary 41 is moved upward to a point k from the point j as shown in FIG. 3 while feeding out the wire 21, the wire 21 is fed out continuously after the kink 34 as shown by FIG. 2 (c). A portion of the wire 21 that is being fed by the upward movement of the capillary 41 is longer than a portion of the wire that has been fed during the previous reverse motion. Then, the tip end of the capillary 41 is moved to a point m shown in FIG. 3 from the point k shown in FIG. 3, and the capillary 41 is moved toward the lead 17 in a looping arch as shown by FIG. 2 (d) and FIG. 2 (e). By this looping, the kink 34 is further bent into a flexed portion 27. Moreover, the kinked portion projecting toward the lead 17 that has been formed in the wire 21 in the oblique-upward rising step is formed into a shape such that the wire 21 that extends from the pressed portion 26 toward the lead 17 projects downward by this looping. Then, the wire 21 is pressure-bonded to the lead 17 by pressing the tip end of the capillary 41 against the lead 17, thereby the bonding is completed. Upon completion of the bonding of the wire 21 to the lead 17, the wire loop 20 that connects the pad 13 serving as the first bonding point with the lead 17 serving as the second bonding point is formed. The assembly of the semiconductor device is completed when all the pads 13 of the semiconductor chip 11 are respectively connected with all the leads 17 of the lead frame 12 by the wire loops 20.

According to the wire-bonding method of this exemplary embodiment, after the height of the ball neck 25 is made low by treading on the ball neck 25 with the face portion 43 of the capillary 41 in the treading step, the wire 21 is folded back and the side surface of the wire 21 is pressed against the trodden portion 25a which has been made lower, and then the wire 21 is looped toward the lead 17. Accordingly, as shown by FIG. 2 (e), a head height H1 of the wire loop 20 of the semiconductor device formed on the pad 13 can be made lower than the height of the loop disclosed by the conventional technique, and thus the height of the wire loop 20 rising from the semiconductor chip 11 can be made even lower. Moreover, as the side surface of the wire 21 is pressed against the substantially flat upper surface of the trodden portion 25a in the pressing step, it is possible to prevent a height H2 of the wire loop 20 between the pressed portion 26 and the lead 17 from becoming high because the wire 21 extending from the pressed portion 26 toward the lead 17 is curved projecting upward when looping, and thus the height of the wire loop 20 rising from the semiconductor chip 11 can be made even lower. In addition, the kinked portion projecting toward the lead 17 that has been formed in the wire 21 in the oblique-upward rising step is formed into the curved shape such that the wire 21 between the pressed portion 26 and the lead 17 projects downward by the looping. With this, it is possible to prevent a case in which the wire 21 extending from the pressed portion 26 toward the lead 17 is curved projecting upward, thereby increasing the height H2 of the wire loop 20 and resulting in an increased height of the wire loop 20 as a whole, and it is also possible to evenly reduce the height of the wire loop 20 as a whole. In this exemplary embodiment, the pressed portion 26 does not stick out of the pressure-bonded ball 23 in a direction of the diameter of the pressure-bonded ball 23.

According to the exemplary embodiment described above, the flexed portion 27 is formed in the wire loop 20 by carrying out the oblique-upward rising step and the kink forming step after the pressing step. However, when there is a little difference in height between the pad 13 and the lead 17, it is possible to connect the pad 13 with the lead 17 by carrying out the second bonding step after the oblique-upward rising step without carrying out the kink forming step.

Figure 5:
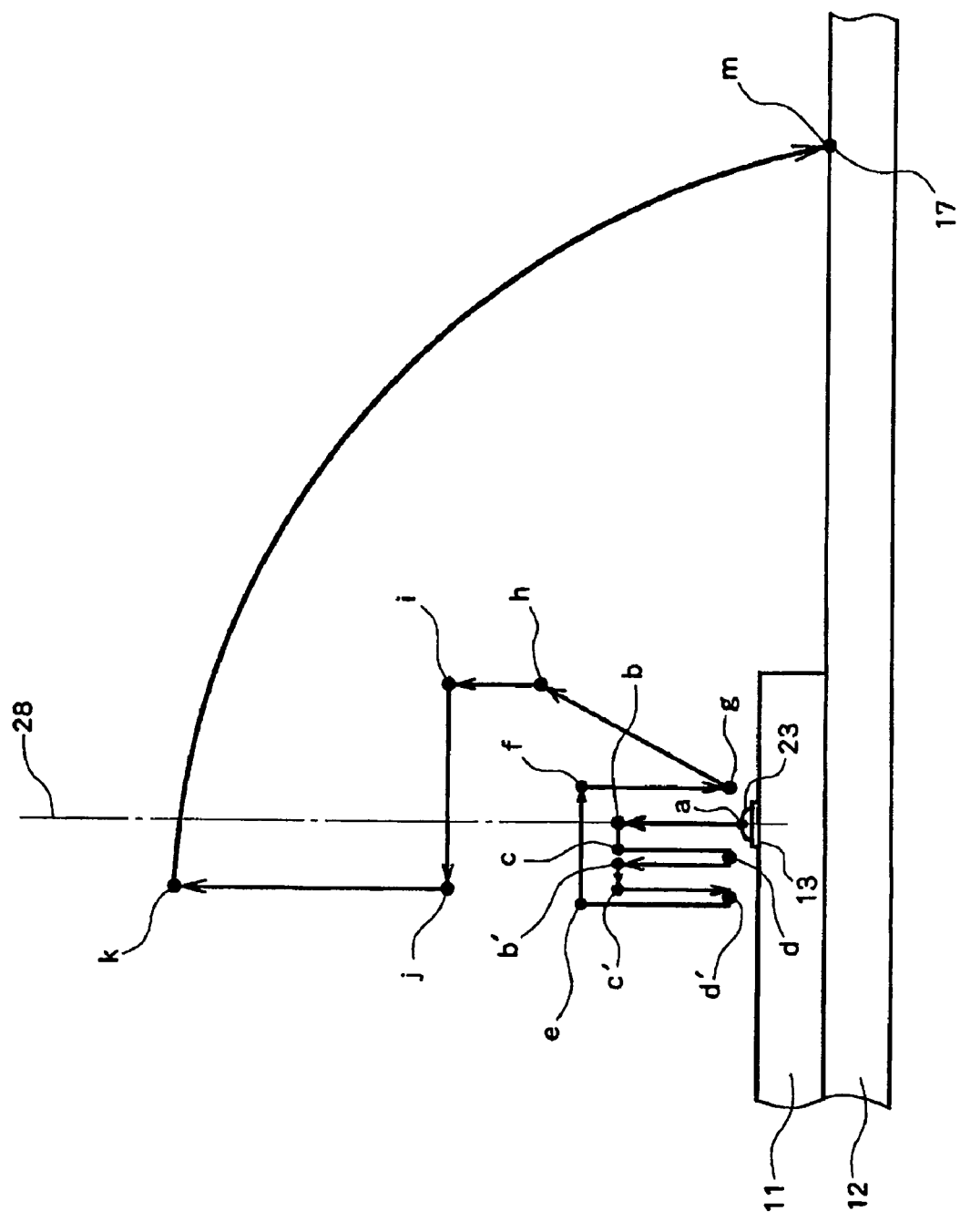
FIG. 5 is an illustrative diagram showing a movement of a tip end of a capillary in the bonding method of a different exemplary embodiment according to the present invention.

Another exemplary embodiment of the present invention is now described with reference to FIG. 4 and FIG. 5. Like components are denoted by the same numerals as those used in the exemplary embodiment described above with reference to FIG. 1 to FIG. 3, and will not be described in detail. This exemplary embodiment relates to a wire-bonding method of wire bonding when the tip end of the capillary 41 is tapered or when using the capillary 41 having a fine tip end, and further relates to a semiconductor device having a wire loop formed by this wire-bonding method.

As shown in FIG. 4, when the tip end of the capillary 41 is fine, the area of the face portion 43 of the capillary 41 is small. Accordingly, it is not possible to sufficiently tread on the ball neck 25 with a single treading, and this often increases the height of the folded-up portion 26a of the wire 21. Therefore, as shown in FIG. 4 and FIG. 5, a series of continuous movement of moving the capillary 41 upward, away from the lead 17, then downward, and treading on the ball neck is repeated twice after the first bonding, such that the ball neck 25 can be sufficiently trodden on.

As shown from FIG. 4 (a) to FIG. 4 (c), after the first bonding, the capillary 41 is moved upward, then moved away from the lead 17, and thereafter moved downward, and then the portion of the ball neck 25 facing toward the lead 17 is trodden on by the face portion 43 which is on the lead 17 side of the capillary 41. In this movement, the tip end of the capillary is moved from the point a, to the point b, to the point c, and then to the point d shown by FIG. 5. However, a distance of the horizontal movement from the point b to the point c is such that a side surface of the face portion 43 on the lead 17 side of the capillary 41 is positioned only slightly away from the lead 17 compared to a side surface of the pressure-bonded ball 23 facing toward the lead 17. By thus moving the capillary 41 downward to tread on the ball neck 25 after having moved the capillary 41 in the horizontal direction in this manner, it is possible to make the upper surface of the ball neck 25 on the lead 17 side suitably into the trodden portion 25a having a flat plane by the face portion 43 which is on the lead 17 side of the capillary 41.

Then, as shown from FIG. 4 (d) to FIG. 4 (f), the capillary 41 is moved upward again, then moved horizontally to the direction away from the lead 17, and moved downward again, and then the portion of the ball neck 25 positioned away from the lead 17 with respect to the trodden portion 25a that has been formed by the previous treading is trodden on by the face portion 43 on the lead 17 side of the capillary 41, thereby increasing the area of the flat surface of the trodden portion 25a. In this movement, the tip end of the capillary moves from the point d, to the point b', to the point c', and then to the point d' shown by FIG. 5. The distance of the horizontal movement from the point b' to the point c' is a necessary distance in order to increase the area of the flat surface of the trodden portion 25a.

Subsequently, after completing the continuous movement of repeating the treading step twice, similarly to the previous exemplary embodiment, the pressed portion 26 is formed by moving the capillary 41 upward, toward the lead 17, and then downward so that the wire 21 is pressed against the trodden portion 25a as shown from FIG. 1 (d) to FIG. 1 (f). Then, the oblique-upward rising step is carried out by moving the wire 21 obliquely upward toward the lead 17, the kink forming step is carried out, and then the wire 21 is bonded to the lead 17 by looping the capillary 41 toward the lead 17. In this exemplary embodiment, the pressed portion 26 does not stick out of the pressure-bonded ball 23 in the direction of the diameter of the pressure-bonded ball 23.

According to the exemplary embodiment described above, the same advantageous effect as that of the previously described exemplary embodiment is provided, and the low wire loop 20 can be formed without fail even with the capillary 41 whose tip end is tapered or the capillary 41 with a fine tip end. Also, according to this exemplary embodiment, the series of continuous movement including the upward movement, the horizontal movement toward the direction away from the lead 17, and the downward movement of the capillary 41, and the treading by the capillary 41 in the treading step is repeated twice. However, a number of repetition of the series of continuous movement is not limited to twice, and the series of continuous movement can be repeated as many times as desired depending on the size of the tip end of the capillary 41.

The invention claimed is:

1. A wire-bonding method of connecting between a first bonding point and a second bonding point by a wire, the method comprising the steps of:
   a first bonding step of bonding an initial ball formed at a tip end of the wire to the first bonding point using a capillary, thereby forming a pressure-bonded ball and a ball neck;
   a ball neck treading step, after the first bonding step, of moving the capillary upward, away from the second bonding point, and immediately downward into contact with the ball neck, thereby treading on a portion of the ball neck facing toward the second bonding point until a surface of the portion is made into a flat surface with a first face portion facing toward the second bonding point of the capillary;
   a pressing step, after the ball neck treading step, of moving the capillary upward and then toward the second bonding point until a second face portion facing away from the second bonding point of the capillary is positioned above the ball neck such that the wire is folded back toward the second bonding point, and subsequently moving the capillary downward, thereby pressing a surface of the wire that has been folded back on the portion of the ball neck that has been trodden on and flattened with the second face portion facing away from the second bonding point of the capillary while bonding and contacting the surface of the wire to the ball neck;
   an oblique-upward raising step, after the pressing step, of moving the capillary obliquely upward toward the second bonding point; and
   a second bonding step, after the oblique-upward raising step, of moving the capillary upward and then toward the second bonding point, and bonding the wire to the second bonding point by pressure-bonding.

2. The wire-bonding method according to claim 1, further comprising:
   a kink forming step, between the oblique-upward raising step and the second bonding step, of moving the capillary upward and then carrying out a reverse motion at least once in which the capillary is moved away from the second bonding point, thereby forming a kink in the wire.

3. A method of bonding a wire to a first bonding point and a second bonding point, the method comprising the steps of:
   a first bonding step of bonding an initial ball formed at the leading end of the wire to the first bonding point, thereby integrally forming a bonded ball and a ball neck, by means of a capillary;
   a ball neck stepping-on step of contacting and stepping on a portion of the ball neck located at the second bonding point side by means of a first face portion of the capillary located at the second bonding point side until the surface of the ball neck is flattened, in such a manner that, after raising and moving the capillary in a direction opposite to the second bonding point, and immediately the capillary is lowered;
   a turning back step of turning the wire back in such a manner that the capillary is raised substantially vertically and subsequently moved toward the second bonding point until a second face portion of the capillary located at an opposite side of the second bonding point is positioned above the ball neck, thereby turning the wire back toward the second bonding point;
   a pressing step of pressing a surface of the wire turned-back on the portion of the ball neck flattened by means of the second face portion of the capillary located at the opposite side of the second bonding point, thereby forming a pressed portion in the first bonding point while lowering the capillary to the ball neck flattened as well as bonding and contacting the surface of the wire thereto;
   a obliquely raising step of obliquely raising the capillary toward the second bonding point; and
   a second bonding step of raising the capillary and subsequently moving the capillary to the second bonding point, thereby bonding the wire to the second bonding point.

4. The method according to claim 3, further comprising a kink forming step of forming a kink on the wire by carrying out a reverse movement between the obliquely raising step and the second bonding step in such a manner that the capillary is raised and subsequently moved in a direction opposite to the second bonding point.

5. A method of bonding a wire to a first bonding point and a second bonding point, the method comprising the steps of:
- a first bonding step;
- a ball neck stepping-on step;
- a turning back step;
- a pressing step;
- a second bonding step;
- the first bonding step of bonding an initial ball formed at the leading end of the wire to the first bonding point, thereby integrally forming a bonded ball and a ball neck, by means of a capillary;
- the ball neck stepping-on step of contacting and stepping on a portion of the ball neck located the second bonding point side by means of a first face portion of the capillary located at the second bonding point side until the surface of the ball neck is flattened, in such a manner that, after raising and moving the capillary in a direction opposite to the second bonding point, and immediately the capillary is lowered;
- the turning back step of turning the wire back in such a manner that the capillary is raised substantially vertically and subsequently moved toward the second bonding point until a second face portion of the capillary located at an opposite side of the second bonding point is positioned above the ball neck, thereby turning the wire back toward the second bonding point;
- the pressing step of pressing a surface of the wire turned-back on the portion of the ball neck flattened by means of the second face portion of the capillary located at the opposite side of the second bonding point, thereby forming a pressed portion in the first bonding point while lowering the capillary to the ball neck flattened as well as bonding and contacting the surface of the wire thereto; and
- the second bonding step of raising the capillary and subsequently moving the capillary to the second bonding point, thereby bonding the wire to the second bonding point.

6. The method according to claim 5, wherein, in the ball neck stepping-on step, the ball neck is formed into a disk-shaped stepped portion whose diameter is smaller than that of the bonded ball.

7. The method according to claim 5, wherein, in the pressing step, the pressed portion remains within a diametrical range of the bonded ball.

8. The method according to claim 5, further comprising:
- an obliquely raising step;
- a vertically raising step;
- the obliquely raising step of, between the pressing step and the vertically raising step; obliquely raising the capillary toward the second bonding point; and
- the vertically raising step of, after completing the obliquely raising step, raising the capillary substantially vertically to the predetermined height.

9. The method according to claim 8, wherein, after completing the second bonding step, a first kink portion on the wire is completed into a shape such that the wire extends from the pressed portion toward the second bonding point by causing the capillary to perform the obliquely raising step and subsequently the vertically raising step, thereby projecting downward in a direction toward the first bonding point.

10. The method according to claim 5, further comprising:
- a second kink forming step; and
- the second kink forming step of forming a second kink on the wire by causing the capillary to carry out a reverse movement between the vertically raising step and the second bonding step in such a manner that the capillary is moved, in a opposite direction to the second bonding point, across a bonding center line the of the first bonding point.

11. The method according to claim 10, wherein, after completing the second bonding step, the second kink portion on the wire is completed into a shape such that the wire extends from the first kink portion to the second bonding point by causing the capillary to perform the second kink forming step, thereby flexing upward in a direction away from the first bonding point.

* * * * *